May 21, 1968 B. L. MIMS 3,384,283

VIBRATORY WIRE BONDING METHOD AND APPARATUS

Filed Oct. 16, 1964 2 Sheets-Sheet 1

INVENTOR.
BRUCE L. MIMS
BY Robert H. Grace
ATTORNEY.

May 21, 1968 B. L. MIMS 3,384,283

VIBRATORY WIRE BONDING METHOD AND APPARATUS

Filed Oct. 16, 1964 2 Sheets-Sheet 2

INVENTOR.
BRUCE L. MIMS
BY Robert H. Ware
ATTORNEY.

United States Patent Office 3,384,283
Patented May 21, 1968

3,384,283

VIBRATORY WIRE BONDING METHOD AND APPARATUS

Bruce L. Mims, Danbury, Conn., assignor to Axion Corporation, Danbury, Conn., a corporation of Connecticut Filed Oct. 16, 1964, Ser. No. 404,440
2 Claims. (Cl. 228—1)

This invention relates to bonding machines for securing fine wire and ribbon connectors to elements of miniature and microminiature electrical circuits. More particularly, the invention concerns methods and apparatus employing vibratory energy in the bonding operation joining connectors to circuit elements.

The advent of microminiature electronics has produced many microscopically small circuit elements and integrated circuits. These often incorporate diffused layers or metallic films deposited on glass or active semiconductor substrates. For example, scores of successive fabricating steps may convert a wafer of glass or oxide crystal through etching, photoengraving, vacuum diffusion, vapor metallizing, heat treatment, scribing and separation into a large plurality of identical dice or chips incorporating either a single device or an integrated circuit on a tiny piece of substrate less than 1/16 inch square.

Such miniature chips or dice require connections to insulated lead-in conductors, and they may also require interconnections between separate elements of the same integrated circuit. Such connections are generally made by mounting the chip within a rectangular "header" or a circular "eyelet" of gold-plated Kovar having eight to fourteen lead-in conductors passing through it and insulated from it by a matched glass-to-metal seal.

Techniques such as "thermocompression bonding" have been developed to bond fine connecting wires joining circuit elements and lead-in conductors, using viewing microscopes and special manipulators to maneuver and bond the connecting wires in position.

With "thermocompression" bonding techniques, the application of clamping force to a connector wire through a welding tip is coupled with the application of heat to the workpiece through its supporting chuck. In order to heat the workpiece to the required temperature of 350 to 400° C., the supporting chuck assembly must often be heated to 500° C. to compensate for radiation and convection heat losses. The high heat of the work station often produces discomfort for the operator and undesirable shimmering mirage effects, sometimes interfering with the operator's observation and alignment of the parts to be bonded, and reducing the precision of the resulting bond.

In addition to "thermocompression bonding," lateral vibratory bonding—often called "sonic" or "ultrasonic" bonding—has also been proposed. See, for example: Jones et al., U.S. Patent No. 2,946,120; Jones et al., U.S. Patent No. 2,946,119; De Prisco, U.S. Patent No. 3,002,270; Jones et al., U.S. Patent No. 3,052,020; Elmore et al., U.S. Patent No. 3,054,309; and Jones, U.S. Patent No. 3,056,192.

These prior art "vibratory" bonding techniques apply vibratory energy to a welding tip. The connector wire is positioned between the welding tip and the workpiece, and held there by the clamping action of the welding tip against the workpiece during the bonding operation. The vibratory energy used in such conventional, prior art bonding techniques produces lateral translation of the welding tip in a direction parallel to the surface of the workpiece, producing shearing stresses between connector and workpiece surface. This parallel or lateral translation of the welding tip produces an elongated, oval-shaped bond, three or more times the diameter of the connector wire in length. Fine connector wires from 0.0005 inch up to 0.010 inch diameter are employed in completing the lead-in connections to microminiature integrated circuit chips or components, which may themselves be only 1/16 of an inch square and such triple elongation of the resulting bond can produce short circuits, misaligned or faulty connections, or damage to neighboring circuit elements.

The present invention takes advantage of the inventor's discovery that vibratory energy producing vibration of a welding tip substantially perpendicular to the surface of the workpiece, or parallel to the direction of the application of clamping force retaining the connector wire between the welding tip and the workpiece, produces unexpectedly good bonds while minimizing the size and area of the bond to increase the precision of the bonding operation. The application of such perpendicular vibratory energy greatly reduces the need for high temperature heating of the workpiece-supporting chuck, and permits heating of the connector wire via the welding tip, by localized heating elements mounted on or in the welding tip support.

Accordingly, a principal object of the present invention is to provide novel methods and apparatus useful in vibratory bonding operations, and particularly in bonding fine wire and ribbon connectors to microminiature electronic circuit elements.

Another object of the invention is to provide such methods and apparatus employing a bonding element resting on the bond and supplied with vibratory energy producing vibratory movement of the bonding element substantially in a direction toward and away from the bond.

A further object of the invention is to provide such methods and apparatus employing a bonding element held against the bond by a substantially perpendicular clamping force, and supplied with vibratory energy producing vibratory movement of the bonding element in a direction substantially parallel to the direction in which the clamping force is applied.

Another object of the invention is to provide such methods and apparatus in which the source of vibratory energy is isolated from the welding operation by a bifurcated structural support similar to a tuning fork.

A further object of the invention is to provide such methods and apparatus employing both vibratory energy and heat energy to perform the bonding operation.

Another object of the invention is to provide methods and apparatus of the above character in which heat is supplied to the bonding operation through the use of localized heating elements directly heating the bonding member applying vibratory energy to the workpiece.

Other and more specific objects will be apparent from the features, elements, combinations and operating procedures disclosed in the following detailed description and shown in the drawings, in which.

Figures 1, 3, 4:
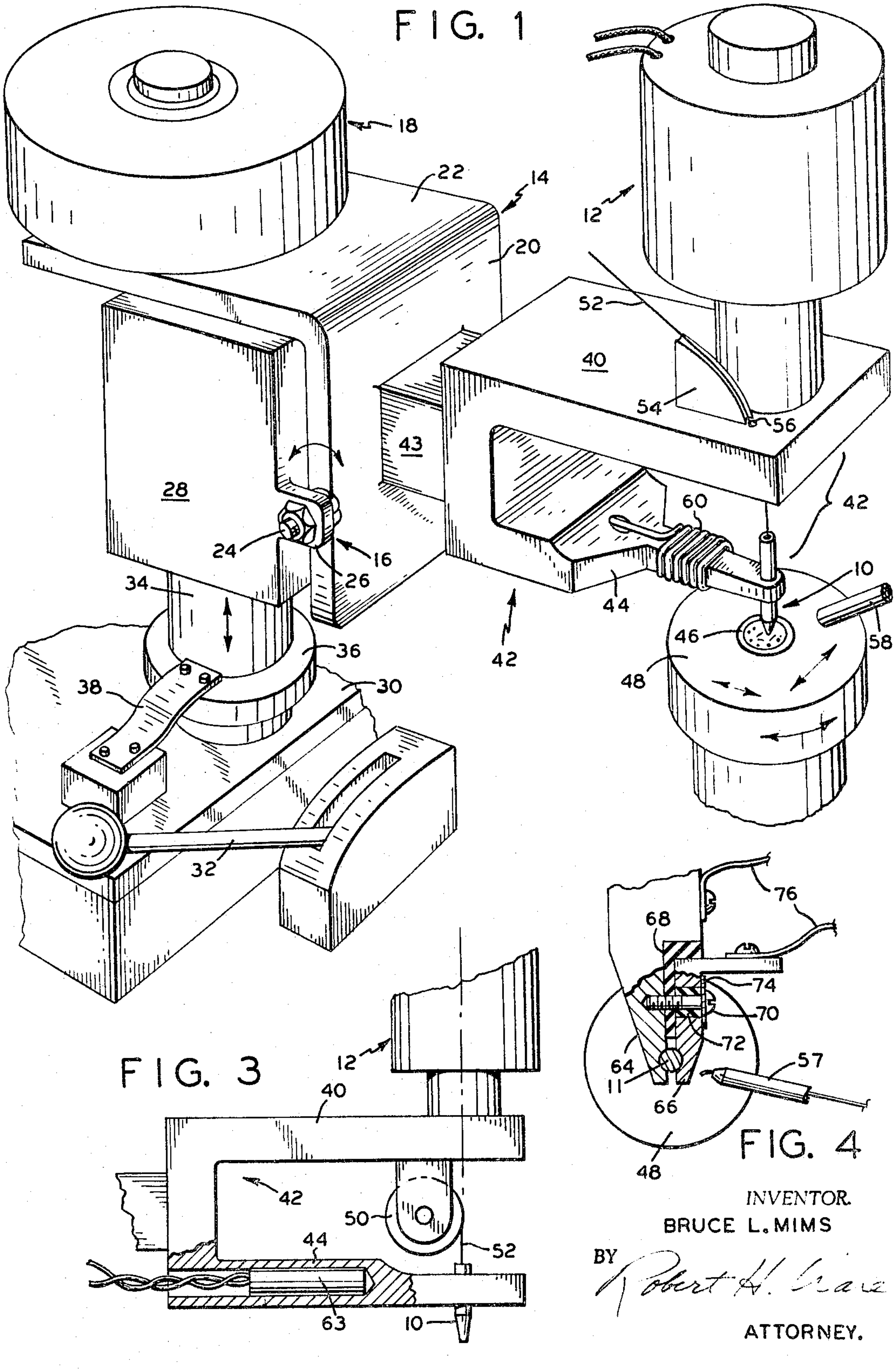
FIGURE 1 is a perspective view of a bonding station showing apparatus useful in performing the bonding methods of the present invention.
FIGURE 3 is a fragmentary side elevation view, partially in section, showing a modification of the embodiment of FIGURES 1 and 2.
FIGURE 4 is a fragmentary top plan view of a portion of another modification of the apparatus shown in FIGURES 1 and 2.

The principal elements incorporated in the various embodiments of this invention are a bonding member such as the tungsten carbide welding tip 10 which supplies vibratory energy directly to the workpiece by way of the connector wire, a vibratory transducer 12, which may be directly coupled to welding tip 10 or may be isolated from the welding tip as described below, and a pivoting, counterbalanced support structure 14, mounted for free pivoting motion about pivots 16 and counterbalanced by a counterweight 18 to apply a light clamping load, of only a few grams, for example, to clamp the connector wire between workpiece and welding tip. All of the preferred embodiments of the invention provide for localized heating of the welding tip by generating or concentrating heat directly in the welding tip or in its supporting shank on the support structure 14.

In all embodiments of the invention, a small electromechanical transducer is employed to produce the vibratory energy, with the direction of its pulsations oriented substantially perpendicular to the surface of the workpiece. Conventional "ultrasonic" coupling techniques are employed, using mechanical amplifiers if desired, to produce high-efficiency energy transmission and maximum vibration amplitude of the end of the welding tip applied to the workpiece, by making this outer end of the welding tip a "node" of the vibratory system.

SUPPORT STRUCTURE

Figures 2, 5, 6:
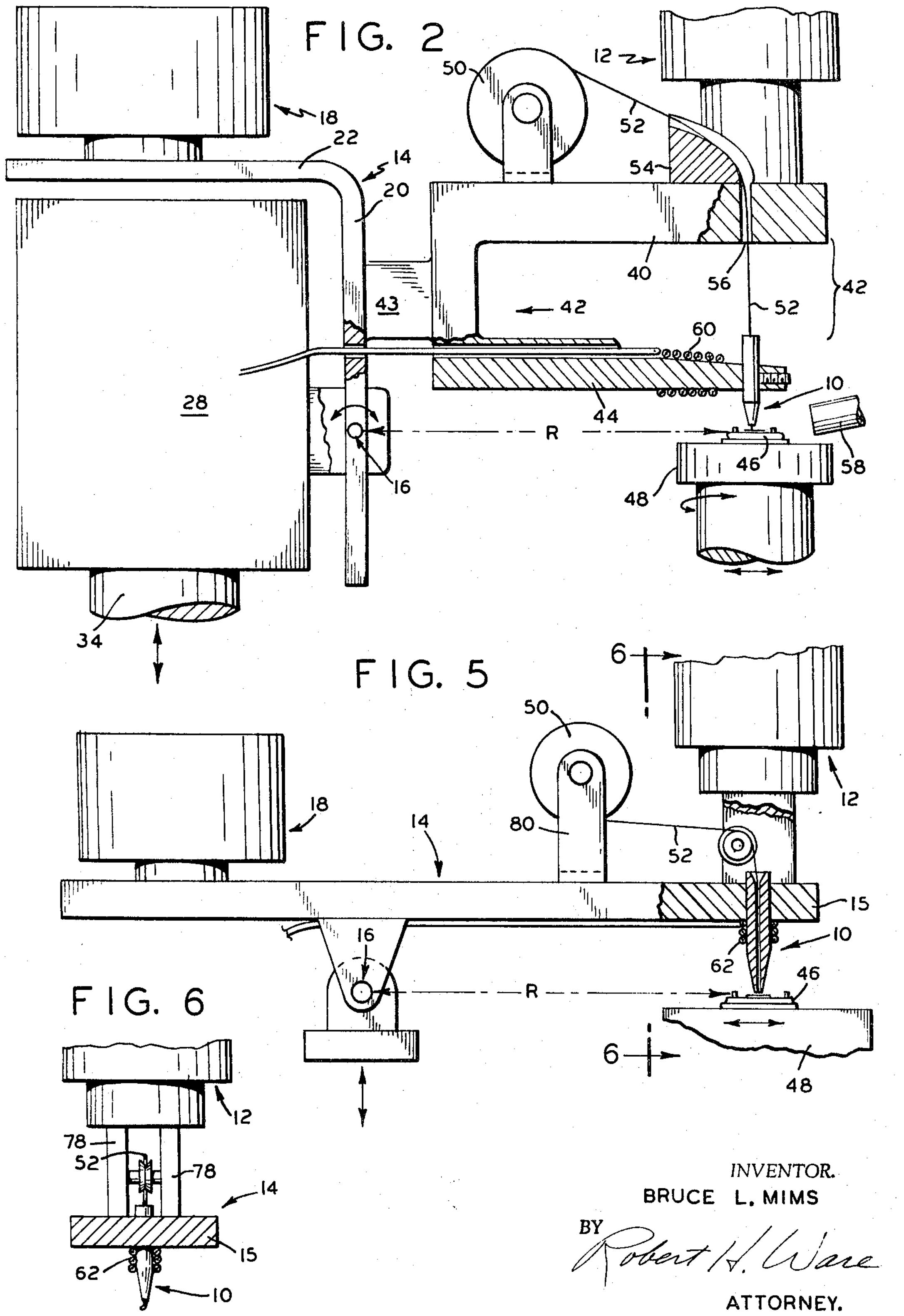
FIGURE 2 is a side elevation view, partially in section, of the apparatus of FIGURE 1.
FIGURE 5 is a side elevation view, partially in section, showing another embodiment of the invention.
FIGURE 6 is a fragmentary cross-sectional elevation view showing the bonding elements of the embodiment of FIGURE 5.

In the embodiment of the invention shown in FIGURES 1 and 2 the support structure 14 includes a substantially vertical panel 20 positioned between two pivots 16 and having a protruding flange 22 supporting the counterweight 18. The panel 20 is held at pivots 16 by a pair of bevel-tipped adjustable threaded studs 24 positioned by lock nuts in a pair of apertured ears 26 protruding from a support block 28 anchored to a slidably movable vertical shaft 34 for vertical movement in a slideway in a base frame 30. A control rod 32 (FIGURE 1) moved by the operator coacts with a standard cam or rack-and-pinion mechanism (not shown) under frame 30 to move the shaft 34 and support block 28 up or down.

A thin leaf spring 38 (FIGURE 1) is employed as an alignment means for controlling the angular position of the shaft 34 slidably movable up and down in the slideway in frame 30. The elongated leaf spring 38 has one end anchored to a flange 36 protruding from shaft 34 and the opposite end anchored to the frame 30, leaving the length of leaf spring 38 free to flex with vertical movement of shaft 34, while anchoring shaft 34 radially to minimize radial play of the welding tip 10.

BIFURCATED COUPLING MEMBER

When maximum isolation of the vibratory transducer 12 from the heated welding tip 10 is desired, a bifurcated coupling member or "tuning fork" 42 supports tip 10 and transducer 12 at the outer ends of its opposed tines.

An upper tine 40 of the fork 42 forms a platform on which is mounted the electromechanical transducer 12, producing vibratory motion of the outer end of tine 40. Fork 42 has its base firmly anchored to the vertical panel 20 and the support structure 14, by an anchor block 43. A lower tine 44 of fork 42 forms a shank in which the welding tip 10 is secured.

As shown in FIGURES 1 and 2, the transducer 12 is a substantially cylindrical structure with its axis substantially perpendicular to tine 40, and it is mounted near the outer unsupported cantilever end of tine 40. The welding tip 10 is a much smaller cylindrical structure secured near the outer cantilever end of lower tine 44, and has its axis substantially coinciding with the axis of the transducer 12. When the transducer 12 is energized, the resulting vibration of upper tine 40 is transmitted by the elastic properties of the fork 42 to create corresponding vibration of the lower tine 44, producing substantial vibratory motion of welding tip 10 in the direction parallel to its axis.

A workpiece 46—which may be an integrated circuit ship or other microminiature electronic structure or component—is held in bonding position on a workpiece supporting chuck 48 which is maneuverable in forward and sidewise directions as indicated by the double arrows shown on the upper surface of chuck 48 in FIGURE 1. The chuck 48 is preferably also moveable in an angular mode, allowing rotation of the workpiece 46. The chuck 48 may be supplied with a central vacuum port acting to hold each workpiece 46 in a central position on the chuck 48. If desired, other forms of workpiece-securing mechanisms may be employed. Maneuvering movement of the chuck 48 by the operator re-positions the same workpiece 46 for many successive bonding operations under the welding tip 10.

WIRE SUPPLY AND GUIDING

The connector material bonded to workpieces by the methods and apparatus of this invention may be ribbon-like strip or round wire formed of gold, aluminum, silver, nickel or such alloys as Kovar. For simplicity, the connector material will be described as "wire." A supply of such fine connector wire, from 0.0005 to 0.010 inch in diameter, is positioned near the welding tip 10. For example, a supply reel 50 may be mounted on the upper side of upper tine 40 as shown in FIGURE 2, or a similar reel 50 may be mounted on the under side of upper tine 40 as indicated in FIGURE 3. The supply source has been omitted from the perspective view of FIGURE 1 for clarity, but the fine connector wire 52 is shown passing along a wire guide 54 and through a feed aperture 56 extending downwardly through upper tine 40 in the direction of the welding tip 10.

In the embodiments shown in FIGURES 1, 2, 3, 5 and 6, the welding tip 10 is a hollow "capillary" welding tip through which the connector wire passes directly to the bonding operation. With a solid welding tip 11 (FIGURE 4), the wire supply and guide means includes a supply reel similar to reel 50, and a fine wire guide needle 57 conducting the wire from the supply reel to the bonding station. Needle 57 may be separately maneuverable to carry wire 52 toward and away from the welding tip.

The wire 52 is clamped between welding tip 10 or 11 and the workpiece 46 by the clamping force applied upon the wire by the welding tip when the support block 28 is lowered by the operator's manipulation of control rod 32. The clamping force is not equal to the weight of the support structure 14, however, because counterweight 18, positioned on the opposite side of pivots 16, substantially counterbalances the weight of the support structure, reducing the clamping force to a very small value which will not damage the delicate parts of the microminiature workpiece 46.

PERPENDICULAR MOVEMENT OF WELDING TIP

As shown in FIGURES 2 and 5, the welding tip 10 is aligned substantially perpendicular to a radius R having the axis of the pivots 16 as its center. Pivoting movement of support structure 14 causes the welding tip 10 to move tangentially to the arc which radius R defines, and this configuration assures that the juxtaposing approach of workpiece 46 and welding tip 10 and the axial vibratory motion of the protruding tip of welding tip 10 will both occur in a direction substantially perpendicular to the surface of workpiece 46 which is positioned parallel to the radius R, in a plane including the pivot axis defined by the two pivots 16. This alignment of the welding tip 10 confines the resulting bond to a minimum region of the workpiece, and eliminates lateral shearing forces tending to displace the workpiece to cause rolling or sliding movement of the connector across the workpiece, or to reduce the effectiveness of the bonding operation.

Transducer 12 may supply vibratory energy at any desired frequency, from 50 c.p.s. to 300,000 c.p.s., for example. Generally transducer 12 will have a resonant frequency in the ultrasonic range between 20,000 c.p.s.

and 60,000 c.p.s.; a vibratory frequency of 40,000 c.p.s. has been found highly effective in bonding both aluminum and gold connector wires 52 to microminiature integrated circuit chips using the bonding techniques of this invention.

ENVIRONMENT CONTROL

As shown in FIGURES 1 and 2, a conduit 58 is positioned above the upper surface of chuck 48 close to the workpiece 46, and connected to supply an inert gas such as nitrogen, flooding the workpiece during the bonding operation to minimize oxidation. In bonding gold wire to a gold workpiece target surface, oxidation is not a serious problem, but with most other materials oxidation must be inhibited by atmosphere control. Workpiece-supporting chuck 48 may be heated, as in thermocompression bonding apparatus, to heat workpiece 46 and connector wire 52, and the vibratory bonding techniques of this invention require less heat than do such conventional bonding techniques, reducing operators' discomfort and heat-mirage-caused bonding errors.

Because the present invention requires lower bonding temperatures and reduced heat, localized heating of the welding tip itself has been discovered to be a highly effective way to supply heat to the bonding operation. In the various embodiments of the invention, heating means are positioned on the support structure 14 close to the welding tip 10. Thus in FIGURES 1 and 2, an elongated tubular heating element such as the American Standard "Aer-O-Rod" miniature Calrod-type heating element 60, first employed for the de-icing of Pitot tubes of high altitude aircraft, is shown extending through a passageway formed in the lower tine 44 of fork 42 and encircling the reduced cantilever end portion of lower tine 44 near the welding tip 10, to supply the desired amount of heat to the welding tip 10. These miniature heating elements are formed in a rod-like shape which may be twisted or distorted to form the coiled configuration shown in FIGURE 1, and both electrical leads enter the rod-like heating element from the remote end thereof, positioned near the pivots 16 to minimize any unbalancing affect the conductors may have on the counterbalanced support structure 14. A similar small diameter rod-like heating element 62 is employed in the embodiment shown in FIGURES 5 and 6, with its extreme end coiled directly about the welding tip 10 supplying heat directly to the welding tip, the connector wire 52 and the workpiece 46 by conduction.

A somewhat larger "Calrod" type heating unit 63, embedded directly in a recess in the lower tine 44 of fork 42 is shown in FIGURE 3. Heating unit 63 produces heating of tine 44, conveying heat by conduction to welding tip 10, connector wire 52 and workpiece 46.

A different arrangement for supplying heat to the bonding operation is illustration in FIGURE 4, where the welding tip 11 is a solid, high-resistivity welding tip rather than the hollow capillary welding tip shown in the other figures. In the top plan sectional view of FIGURE 4, the solid welding tip 11 is gripped between two conductive electrodes 64 and 66, otherwise insulated from each other by an insulating spacer 68 and clamped together by a clamping screw 70 threaded into electrode 64 and applying clamping force through an insulating bushing 72 and a washer 74 against the electrode 66. The electrodes 64 and 66 are connected to electrical lead-in wires 76 carrying heating current, which is applied directly across the solid welding tip 11, whose internal resistance to the current flow creates the desired heating of the welding tip 11 to supply heat to the bonding operation.

DIRECT-COUPLED TRANSDUCER

The fork structure 42 shown in FIGURES 1, 2 and 3 effectively isolates the transducer 12 from the heated welding tip 10, and heat-sensitive transducers can therefore be employed without risk of heat damage to the transducer.

Transducers 12 which are not heat-sensitive may be mounted on a common support structure 14 close to the welding tip 10, as shown in FIGURES 5 and 6, eliminating the fork 42 with its separate tines. In FIGURES 5 and 6, support structure 14 is a single platform 15 supported on pivots 16, and the transducer 12 is mounted on two column members 78 flanking the welding tip 10 at the outer end of the platform 15. Column members 78 couple the transducer 12 to welding tip 10 via platform 15, producing the desired axial vibratory motion of the welding tip, which is heated as shown in FIGURES 5 and 6 by a tubular heating element 62 coiled directly about welding tip 10 beneath platform 14. The supply reel 50 is shown in FIGURE 5 mounted on arms 80 upstanding from platform 15, and the counterweight 18 is mounted at the opposite end of platform 15, beyond pivots 16, to balance the weight of transducer 12, supply reel 50, welding tip 10 and associated elements. The clamping force applied when welding tip 10 is lowered to urge connector wire 52 against workpiece 46 is thus reduced by the counterweight 18 to the desired small value which will avoid distortion or damage to the workpiece 46.

BONDING OPERATIONS

In the bonding techniques of this invention, connector wire 52 is conducted from the supply reel 50 to the "bonding station," between the end of welding tip 10 and the selected target portion of the workpiece 46.

Employing a conventional wire-severing technique, such as shearing, hot-wire melting or a swinging gas flame, the connector wire is severed at the bonding station and deformed into a bent end or a fused drop. This deformed free end of connector wire 52 pervents withdrawal of wire 52 through capillary tip 10 or needle 57, and speeds the start of each bonding operation.

After wire 52 is conducted to the bonding station, the chuck 48 and support structure 14 are moved together, clamping wire 52 between tip 10 and workpiece 46. The operator controls this approach, maneuvering the chuck 48 to bring the selected target portion of the workpiece directly into juxtaposition with the welding tip. The weight of support structure 14 is almost completely counterbalanced by counterweight 18, reducing the clamping force exerted by the tip 10 to the desired small value, sufficient to clamp wire 52 in bonding position without damaging workpiece 46.

The operator then actuates transducer 12 to supply vibratory energy to welding tip 10. The transducer 12 will normally be energized for only a brief period, i.e., for a pulse from 1/10 of a second to one second in length, controlled by a timing mechanism or a pulse generating circuit, to supply only a short burst of vibratory energy to the connector wire 52 at the bonding station. The application of oscillating compressive force through wire 52 to the target portion of workpiece 46 causes severe vibratory disorganization of the juxtaposed regions of wire 52 and workpiece 46, although very small amplitudes of vibration are employed, in the neighborhood of 0.001 inch, for example.

While the mechanism of the resulting bonding action is not fully understood, it is known that oxides, scale, dust and foreign particles are fragmented and expelled from the bonding zone, that the crystalline or molecular structure of wire 52 and workpiece 46 is significantly altered, and that a highly effective mechanical and electrical bond results from the application of vibratory energy in an oscillatory mode substantially perpendicular to the target surface of workpiece 46, particularly when some degree of local heating is supplied in conjunction with the perpendicular vibratory compressive force.

The moderate local heating, to a temperature between 300° and 400° C., for example, does not produce melting of either bonded member, and no electric current or electric arc passes through the bond. Thus fusing, sputtering, pitting and contamination of the bond are avoided, and distortion, size constriction and warping cannot result.

Highly efficient successive bonding operations may thus be performed on the same workpiece, connecting circuit elements to each other or to nearby lead-in terminals. A wire-severing step follows the bonding of each complete connection, and a freshly deformed end of wire 52 is then presented to form the next connection until the workpiece is completed and a fresh workpiece is placed on chuck 48, ready for a similar cycle of bonding operations.

While the objects of the invention are efficiently achieved by the preferred forms of the invention described in the foregoing specification, the invention also includes changes and variations falling within and between the definitions of the following claims.

I claim:

1. Bonding apparatus for joining a connector wire to a workpiece, comprising in combination:

(A) a welding tip;

(B) a workpiece-supporting chuck;

(C) maneuverable means for bringing each of a plurality of different selected target portions of a workpiece supported on the chuck into successive juxtaposition with the welding tip, to create a predetermined small clamping force successively between the welding tip and each workpiece target portion;

(D) a wire-supply source positioned to introduce a length of connector wire between welding tip and workpiece target portion;

(E) and a source of vibratory energy coupled to vibrate the welding tip in a direction substantially parallel to the line of action of the clamping force by a bifurcated tuning fork member provided with opposed tines respectively supporting the vibratory energy source and the welding tip.

2. Bonding apparatus for joining a connector wire to a workpiece comprising in combination:

(A) a support structure pivotally mounted on a pivot axis;

(B) a welding tip held by the support structure;

(C) a workpiece-supporting chuck maneuverably positioned near the support structure to present a target surface of a workpiece supported thereon for juxtaposition with a clamping portion of the welding tip, with the target surface lying substantially in a plane passing through the pivot axis;

(D) an electromechanical transducer mounted on the support structure and coupled to produce vibratory motion of the clamping portion of the welding tip in a direction of vibration substantially perpendicular to the juxtaposed workpiece target surface by a bifurcated tuning fork member provided with opposed tines respectively supporting the transducer and the welding tip;

(E) adjacently-mounted connector wire supply means;

(F) guide means conducting connector wire from the supply means to a bonding position between the welding tip and the workpiece target surface;

(G) heating means mounted on the support structure close to the welding tip to supply heat through the welding tip to the connector wire;

(H) a counterweight mounted on the support structure positioned to counterbalance the main portion of the weight of the pivotally-mounted support structure, except for a small clamping force produced by the welding tip resting on the target surface;

(I) and control means for moving the workpiece on the workpiece-supporting chuck and the welding tip into juxtaposed contact.

References Cited

UNITED STATES PATENTS

| | | | |
|---|---|---|---|
| 3,087,239 | 4/1963 | Clagett | 29—497.5 |
| 3,101,635 | 8/1963 | Kuliche | 228—13 |
| 3,125,803 | 3/1964 | Rich | 29—482 |
| 3,149,510 | 9/1964 | Kulicke | 228—44 |
| 3,314,582 | 4/1967 | Haigler | 228—3 |

FOREIGN PATENTS

| | | |
|---|---|---|
| 1,087,440 | 8/1954 | France. |

RICHARD H. EANES, Jr., *Primary Examiner.*